United States Patent [19]
Okajima

[11] Patent Number: 5,200,921
[45] Date of Patent: Apr. 6, 1993

[54] SEMICONDUCTOR INTEGRATED CIRCUIT INCLUDING P-CHANNEL MOS TRANSISTORS HAVING DIFFERENT THRESHOLD VOLTAGES

[75] Inventor: Yoshinori Okajima, Kawasaki, Japan
[73] Assignee: Fujitsu Limited, Kanagawa, Japan
[21] Appl. No.: 921,380
[22] Filed: Jul. 30, 1992

Related U.S. Application Data
[63] Continuation of Ser. No. 762,116, Sep. 19, 1991, abandoned.

[30] Foreign Application Priority Data
Sep. 20, 1990 [JP] Japan ................... 2-252525

[51] Int. Cl.$^5$ .............................................. G11C 7/06
[52] U.S. Cl. ................... 365/189.11; 365/181; 365/226; 307/264; 307/363; 307/451; 307/475
[58] Field of Search ............... 307/264, 350, 363, 451, 307/475; 365/189.11, 226, 181

[56] References Cited
U.S. PATENT DOCUMENTS 5,068,553  11/1991  Love ..................... 307/451
5,073,726  12/1991  Kato et al. .............. 307/475
5,113,097  5/1992  Lee ......................... 307/475
5,113,434  5/1992  Aizaki ..................... 307/475
5,117,131  5/1992  Ochi et al. ............... 307/451

FOREIGN PATENT DOCUMENTS 2510781  2/1983  France .
59-112640  6/1984  Japan .

OTHER PUBLICATIONS

Patent Abstracts of Japan, vol. 8, No. 231 (E-274), Oct. 24, 1984.

Primary Examiner—Joseph E. Clawson, Jr.
Attorney, Agent, or Firm—Nikaido, Marmelstein, Murray & Oram

[57] ABSTRACT

A semiconductor integrated circuit includes a first P-channel MOS transistor and a second P-channel MOS transistor. The drain of the first P-channel MOS transistor is connected to the gate of the second P-channel MOS transistor. The second P-channel MOS transistor has a threshold voltage (a gate potential with respect to a source potential) greater than that of the first P-channel MOS transistor.

8 Claims, 6 Drawing Sheets

SEMICONDUCTOR INTEGRATED CIRCUIT INCLUDING P-CHANNEL MOS TRANSISTORS HAVING DIFFERENT THRESHOLD VOLTAGES

This application is a continuation of application Ser. No. 07/762,116 filed Sep. 19, 1991, now abandoned.

BACKGROUND OF THE INVENTION (1) Field of the Invention

The present invention generally relates to semiconductor integrated circuits, and more particularly to a semiconductor integrated circuit including P-channel MOS (Metal Oxide Semiconductor) transistors having different threshold voltages.

(2) Description of the Prior Art

Recently, there has been considerable activity in the development of methods of reducing the feature size of an LSI pattern. Normally, the breakdown voltages of elements of the LSI circuit decrease as the feature size diminishes. From this point of view, use of a power supply voltage lower than a normal (external) power supply voltage has been proposed. Such a power supply voltage is called a dropped power supply voltage.

FIG.1 is a circuit diagram of a conventional semiconductor integrated circuit in which a normal power supply voltage $V_{CC}$ and a dropped power supply voltage $V_{RC}$ are used. The circuit shown in FIG.1 is composed of CMOS inverters 10 and 11, which are cascaded. The CMOS inverter 10 is, for example, an input circuit, and CMOS inverter 11 is, for example, a first stage of an internal circuit. The CMOS inverter 10 is composed of a P-channel MOS (PMOS) transistor 13 and an N-channel MOS (NMOS) transistor 14. The CMOS inverter 11 is composed of a PMOS transistor 15 and an NMOS transistor 16.

The normal power supply voltage $V_{CC}$, which is generated by an external power source and equal to, for example, 5 V, is applied to the source of the PMOS transistor 13. The source of the NMOS transistor 14 is grounded (zero volt; GND). Hereinafter, the CMOS inverter 10 is referred to as a $V_{CC}$ system gate circuit 10. The dropped power supply voltage $V_{RC}$, which is generated by an internal power supply circuit on the chip and equal to, for example, 4 V, is applied to the source of the PMOS transistor 15. The source of the NMOS transistor 16 is grounded. Hereinafter, the CMOS inverter 11 is referred to as a $V_{RC}$ system gate circuit 11.

An input signal, which is input to the potential $V_{CC}$ system gate circuit 10, has a high logic level (a binary numeral) approximately equal to the potential $V_{CC}$ (5 V) and a low logic level (a binary numeral) approximately equal to the ground potential GND (OV). When the input signal has the high logic level, the NMOS transistor 14 is ON and thus the $V_{CC}$ system gate circuit 10 outputs the low logic level to the $V_{RC}$ system gate circuit 11. A potential at which the PMOS transistor 13 turns ON from OFF is equal to a potential obtained by adding a threshold voltage $V_{TH13}$ of the PMOS transistor 15 approximately equal to $-0.6$ V to the potential $V_{CC}$.

The input signal of the $V_{RC}$ system gate circuit 11 (which corresponds to the output signal of the $V_{CC}$ system gate circuit) has a high logic level approximately equal to the potential $V_{CC}$ and a low logic level approximately equal to the ground potential GND. When the input signal of the $V_{RC}$ system gate circuit 11 has the high logic level, the NMOS transistor 16 is ON, and thus the $V_{RC}$ system gate circuit 11 generates the low logic level approximately equal to the ground potential GND. When the input signal of the $V_{RC}$ system gate circuit 11 has the low logic level, the PMOS transistor 15 is ON, and thus the $V_{RC}$ system gate circuit 11 generates the high logic level approximately equal to the potential $V_{RC}$. A potential at which the PMOS transistor 15 turns ON from OFF is equal to a potential obtained by adding a threshold voltage $V_{TH15}$ of the PMOS transistor 15 to the dropped potential $V_{CC}$, and is approximately equal to $-0.6$ V.

In the above-mentioned way, the breakdown voltage of the $V_{RC}$ gate circuit 11 substantially increase by using the dropped power supply voltage $V_{RC}$. Since the $V_{CC}$ system gate circuit 10 functions as the input buffer circuit, it is required to have a high driving ability. From this point of view, the normal power supply voltage $V_{CC}$ is applied to the $V_{CC}$ system gate circuit 10. The PMOS transistors 13 and 15 are produced by the same process.

However, the circuit shown in FIG. 1 has the following disadvantage arising from the fact that the threshold voltage $V_{TH15}$ of the PMOS transistor 15 of the $V_{RC}$ system gate circuit 11 is the same as the threshold voltage $V_{TH13}$ of the PMOS transistor 13 of the $V_{CC}$ system gate circuit 10. As shown in FIG. 2A, when the PMOS transistor 13 turns ON when the input signal decreases and becomes equal to 4.4 V. In this case, the PMOS transistor 13 has a threshold voltage of $-0.6$ V. It takes time t1 the PMOS transistor 13 to turn ON. Meanwhile, as shown in FIG.2B, the PMOS transistor 15 turns ON when the output signal of the $V_{CC}$ system gate circuit 10 decreases and becomes equal to 3.4 V ($= +4 V + (-0.6 V)$). Thus, it takes a time t2 longer than time t1 for the PMOS transistor 15 to turn ON. That is, the switching speed of the $V_{RC}$ system gate circuit 11 is smaller than that of the $V_{CC}$ system gate circuit 10.

As described above, the threshold voltage of the PMOS transistor corresponds to a gate potential with respect to the source potential. Thus, when the PMOS transistor 15 is produced under the same condition as the PMOS transistor 13, the threshold voltage $V_{TH15}$ corresponds to a potential lower than the source potential by 0.6 V.

The above problem will take place in a circuit shown in FIG.3. Two $V_{RC}$ system circuits 17 and 18 are mutually connected via a PMOS transistor 19, which is driven by a $V_{CC}$ system gate circuit (CMOS inverter) 20. Since the PMOS transistor 19 has a long switching time, as described above with reference to FIG.2B, a delay in the signal transmission between the $V_{RC}$ system circuits 17 and 18 occurs.

SUMMARY OF THE INVENTION

It is a general object of the present invention to provide an improved semiconductor integrated circuit in which the above disadvantages are eliminated.

A more specific object of the present invention is to provide a semiconductor integrated circuit having a reduced switching delay time of a PMOS transistor receiving a dropped power supply voltage.

The above objects of the present invention are achieved by a semiconductor integrated circuit comprising a first circuit outputting an output signal having a high logic numeral approximately equal to a first power supply potential, and a second circuit receiving the output signal. The first circuit comprises a first P-channel MOS transistor having a source receiving the first power supply potential and a drain output the output signal. The second circuit comprises a second P-channel MOS transistor having a gate receiving the output signal, a source receiving a second power supply potential lower than the first power supply potential, and a drain connected to an output terminal. The first and second P-channel MOS transistors respectively have threshold voltages at which predetermined identical drain currents defining a boundary between ON and OFF states of the first and second P-channel MOS transistors are obtained, each of the first and second threshold voltages being a gate-source voltage corresponding to a potential of the gate with respect to the source. The second threshold voltage of the second P-channel MOS transistor is greater than the first threshold voltage of the first P-channel MOS transistor.

BRIEF DESCRIPTION OF THE DRAWINGS

Other objects, features and advantages of the present invention will become more apparent from the following detailed description when read in conjunction with the accompanying drawings, in which.

DESCRIPTION OF THE PREFERRED EMBODIMENTS

Figure 1:
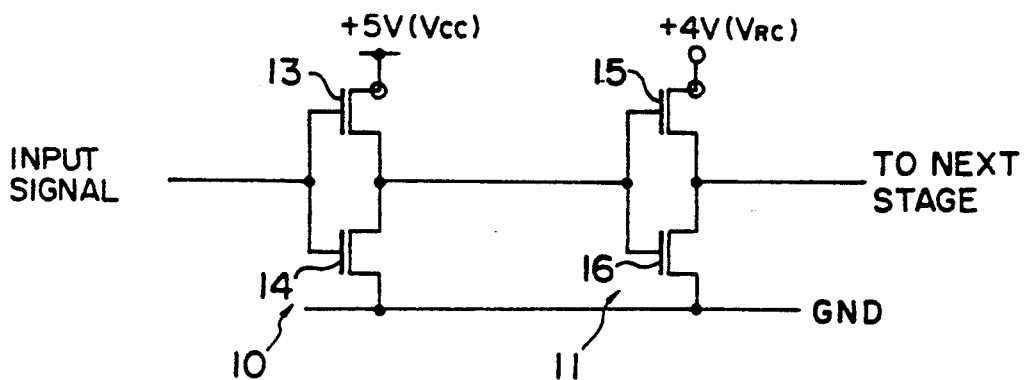
FIG. 1 is a circuit diagram of a conventional semiconductor integrated circuit in which a normal power supply voltage and a dropped power supply voltage are used.
Figure 3:
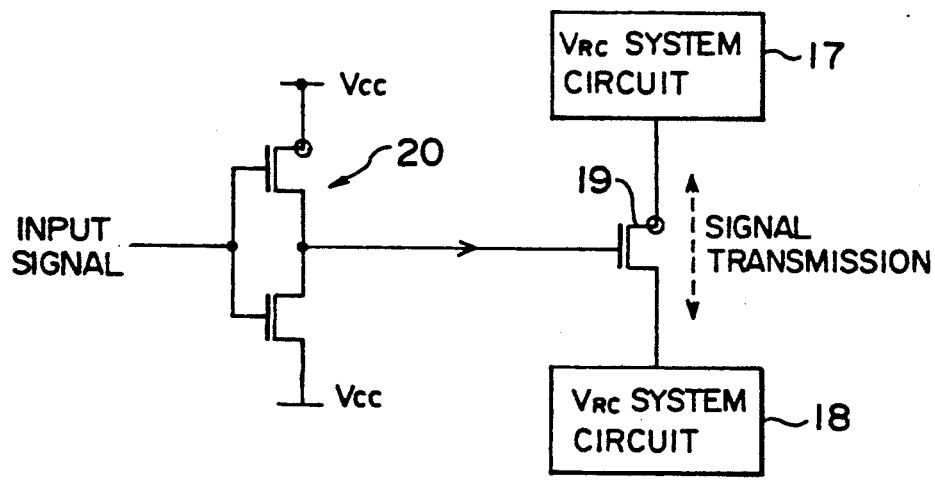
FIG. 3 is a circuit diagram of another conventional semiconductor integrated circuit having the same problem as that of the circuit shown in FIG.1.
Figure 2A:
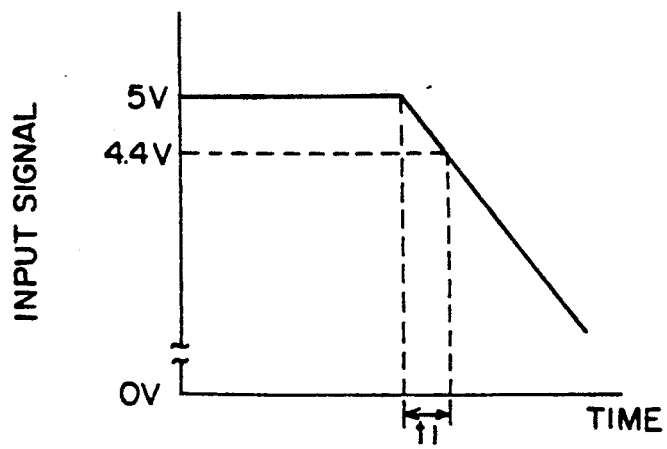
FIGS. 2A and 2B are waveform diagrams showing the operation of the circuit shown in FIG.1.
Figure 2B:
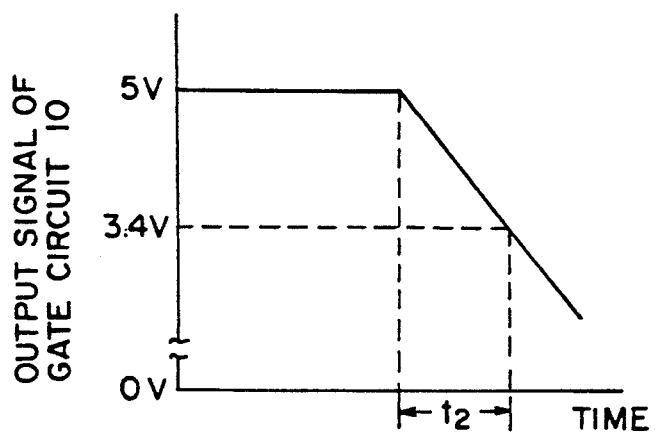
Figure 4:
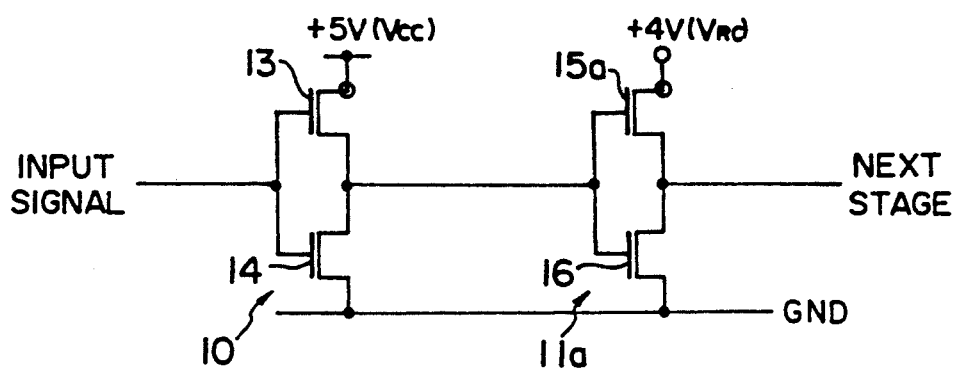
FIG. 4 is a circuit diagram of a semiconductor integrated circuit according to a preferred embodiment of the present invention.

Referring to FIG.4, a PMOS transistor 15a is substituted for the PMOS transistor 15 shown in FIG.1. A $V_{RC}$ system gate circuit (CMOS inverter) 11a is composed of the PMOS transistor 15a and the aforementioned NMOS transistor 16. The other elements shown in FIG.4 are the same as those shown in FIG.1. The PMOS transistor 15a has an increased threshold voltage $V_{TH15a}$ which allows the PMOS transistor 15a to turn ON at a potential higher than the potential equal to 3.4 V shown in FIG.2B.

Figure 5:
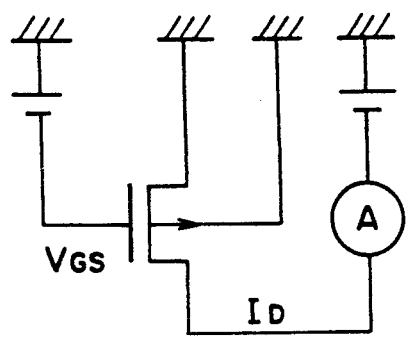
FIG. 5 is a circuit diagram of a system for defining the threshold voltage of a PMOS transistor.

The threshold voltage of a PMOS transistor will now be defined with reference to FIG.5. The threshold voltage of the PMOS transistor is the potential of the gate with respect to the source ($V_{GS}$) which is obtained when a predetermined drain current $I_D$ (equal to, for example, 1 μm) is obtained.

Figure 6:
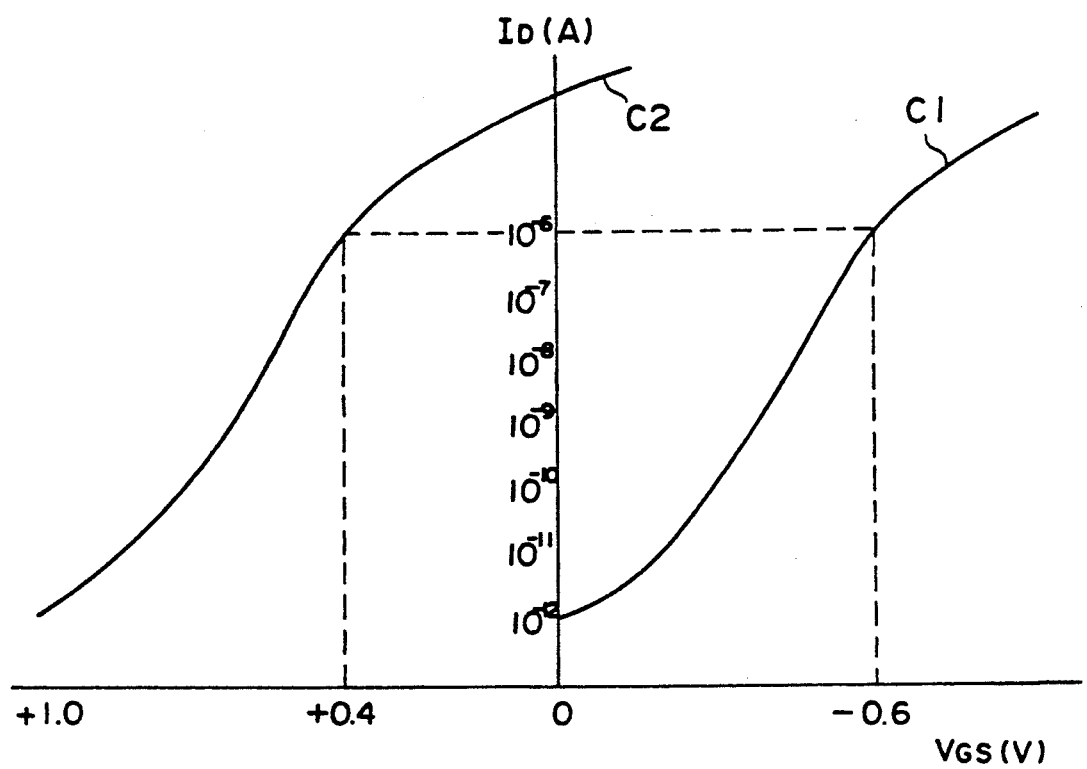
FIG. 6 is a graph showing the threshold voltage of the PMOS transistor shown in FIG.5.

Referring to FIG.6, there are illustrated a curve C1 showing a drain current ($I_D$) vs. gate-source voltage ($V_{GS}$) characteristic of the PMOS transistor 15 shown in FIG.1 and a curve C2 showing a $I_D$ vs. $V_{GS}$ characteristic of the PMOS transistor 15a. The curve C1 shows that the drain current $I_D$ equal to 1 μm is obtained when the potential of the gate of the PMOS transistor 15 is 0.6 V lower than that of the source, that is, when $V_{GS}$ is −0.6 V. It will be noted that a gate-source voltage $V_{GS}$ of 0 V corresponds to a potential 4 V with respect to the ground level GND equal to 0 V. Thus, a gate-source voltage $V_{GS}$ of −0.6 V corresponds to 3.4 V with respect to the ground level. The drain current $I_D$ is substantially zero when $V_{GS}$ is −0.6 V.

Meanwhile, according to the present invention, the PMOS transistor 15a has a threshold voltage $V_{TH15a}$ greater than −0.6 V. In other words, the gate potential of the PMOS transistor 15a with respect to its source potential is set to be higher than −0.6 V. A maximum gate potential of the PMOS transistor 15a with respect to the source voltage is approximately equal to +0.4 V, as shown by the curve C2. It will be noted that +1 V of the gate-source voltage $V_{GS}$ corresponds to a potential of +5 V with respect to the ground level (0 V). That is, +1 V of the gate-source voltage $V_{GS}$ corresponds to the maximum level of the signal which is input to the gate of the PMOS transistor 15a of the $V_{RC}$ system gate circuit 11a. At this time, the PMOS transistor 15a should be definitely OFF and the drain current is substantially zero. In other words, the maximum gate-source voltage $V_{GS}$ corresponds to a potential which is 0.6 V lower than the maximum level applied to the gate of the PMOS transistor 15a. It can be seen from the above description that the PMOS transistor 15a operates at a higher speed when $-0.6 < V_{GS} \leq +0.4$ V is satisfied.

Figure 7:
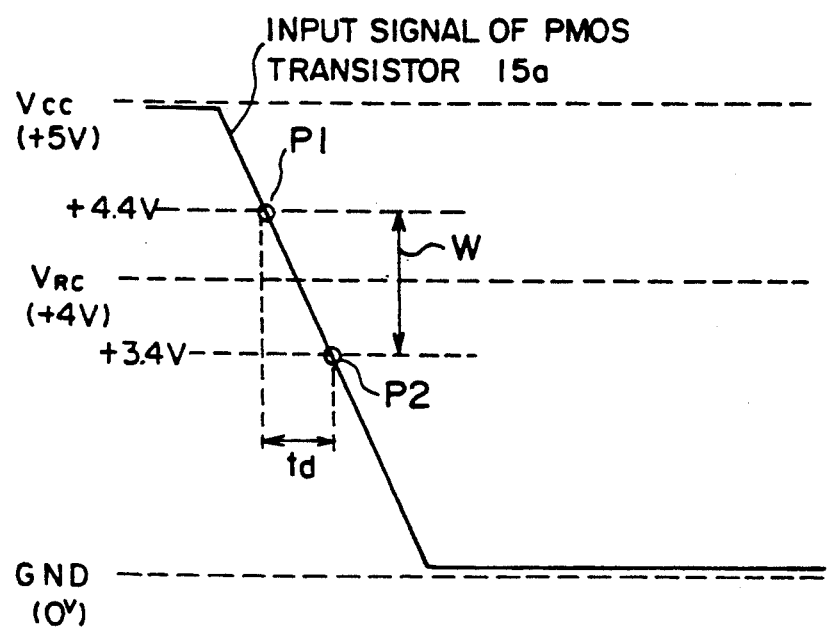
FIG. 7 is a waveform diagram showing the threshold voltage of the PMOS transistor.

FIG.7 is a waveform diagram corresponding to the graph of FIG.6. FIG.7 shows the potentials with respect to the ground level. A point P2 corresponds to a gate-source voltage $V_{GS}$ of −0.6 V, and a point P1 corresponds to a gate-source voltage $V_{GS}$ of +0.4 V. According to the present invention, it is possible to place the threshold voltage $V_{TH15a}$ of the PMOS transistor 15a at any point within a range W between +4.4 V and +3.4 V. It will be noted that the delay time $t_2$ (FIG.2B) reduces as the threshold voltage $V_{TH15a}$ becomes closer to the point P1, and becomes equal to $t_1$ (FIG.2A) when the threshold voltage $V_{TH15a}$ of the PMOS transistor 15a is equal to 4.4 V. In this case, the PMOS transistor 15a switches by a time $t_d$ faster than the PMOS transistor 15.

It should be noted that a bulk of the PMOS transistor 15a can be maintained at either −5 V or 4 V. The curve C2 of the PMOS transistor 15a does not change greatly based on the potential of the bulk.

Figure 8:
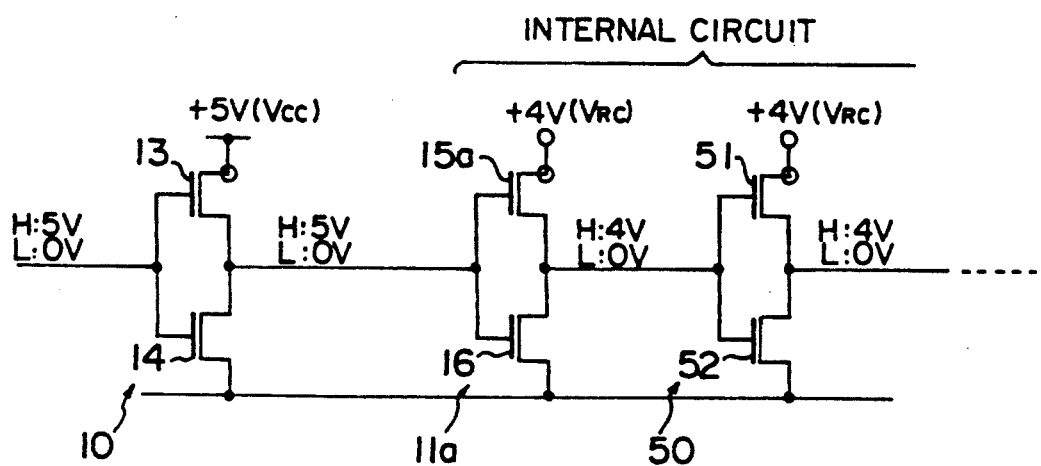
FIG. 8 is a circuit diagram of the semiconductor integrated circuit shown in FIG.4 in detail.

It should be noted that the PMOS transistor 15a shown in FIG.4 is located in the first stage of a $V_{RS}$ system internal circuit, as shown in FIG.8. As shown, the $V_{RS}$ system internal circuit has a $V_{RS}$ system gate circuit 50 which is composed of a PMOS transistor 51 and an NMOS transistor 52 and connected to the output terminal of the $V_{RS}$ system gate circuit 11a. A threshold voltage $V_{TH51}$ of the PMOS transistor 51 may be the same as the threshold voltage $V_{TH13}$ of the PMOS transistor 13, because the $V_{RS}$ system gate circuit 50 receives the maximum level equal to 4 V. That is, it is enough for only the first-stage PMOS transistor 15a to have the improved threshold voltage $V_{TH15a}$.

Each of the NMOS transistors 16 and 52 can be formed by using a feature size smaller than that of the NMOS transistor 14. For example, each of the NMOS transistor 16 and 52 has a feature size of 0.5 μm, while the NMOS transistor 14 has a feature size of 0.8 μm. On the other hand, it is preferable that each of the PMOS transistors 15a and 51 has a feature size identical to that of the PMOS transistor 13 in order to prevent a decrease in the breakdown voltage and influence of hot carriers. For example, each of the PMOS transistors 13, 15a and 51 has a feature size of 0.8 μm.

Figure 9:
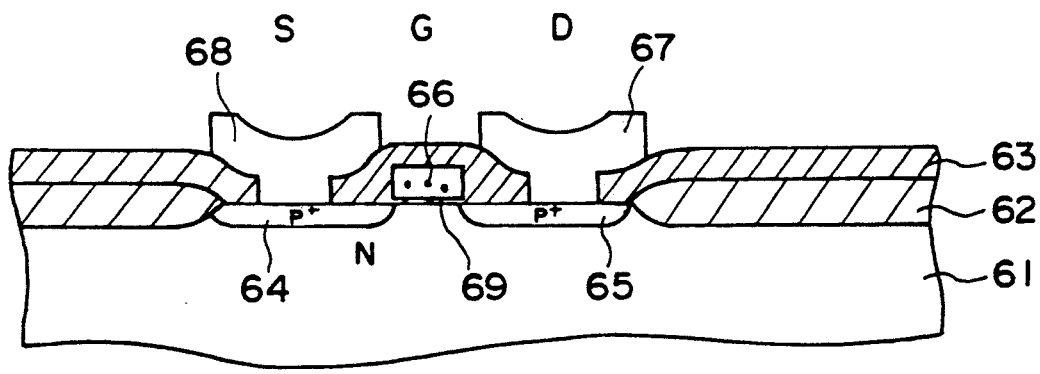
FIG. 9 is a cross-sectional view of the PMOS transistor.

FIG.9 is a cross-sectional view of the PMOS transistor. As shown, a p+-type diffused region 64 and a p+-type diffused region 65 are formed in an n-type substrate 61. A field insulating layer 62 and an insulating layer 63 are formed as shown in FIG.9. A gate electrode 66 is formed on a gate insulating layer 69. A source electrode 68 is connected to the p+-type region 64 through a contact hole, and a drain electrode 67 is connected in the p+-type region 65 through a contact hole.

Generally, the threshold voltage of the PMOS transistor is based on an impurity dose of an interface portion of a channel region and an impurity dose of a (substrate) portion deeper than the interface. When the n-type substrate 61 has a high initial dose, the threshold voltage of the PMOS transistor can be adjusted by introducing a p-type dopant into the n-type substrate 61. For example, a p-type dopant having a dose of $10^{10}$–$10^{11}$ atoms/cm$^2$ is introduced. Meanwhile, when the n-type substrate 61 has a low initial dose, the threshold voltage of the PMOS transistor can be adjusted by 1) introducing a p-type impurity into the n-type substrate 61, 2) introducing an n-type impurity therein, or 3) introducing nothing. Which one should be selected is based on the initial dose of the n-type substrate 61. In this case, it is necessary to make the impurity dose at the interface in the channel area close to the p-type conductivity.

Figure 10:
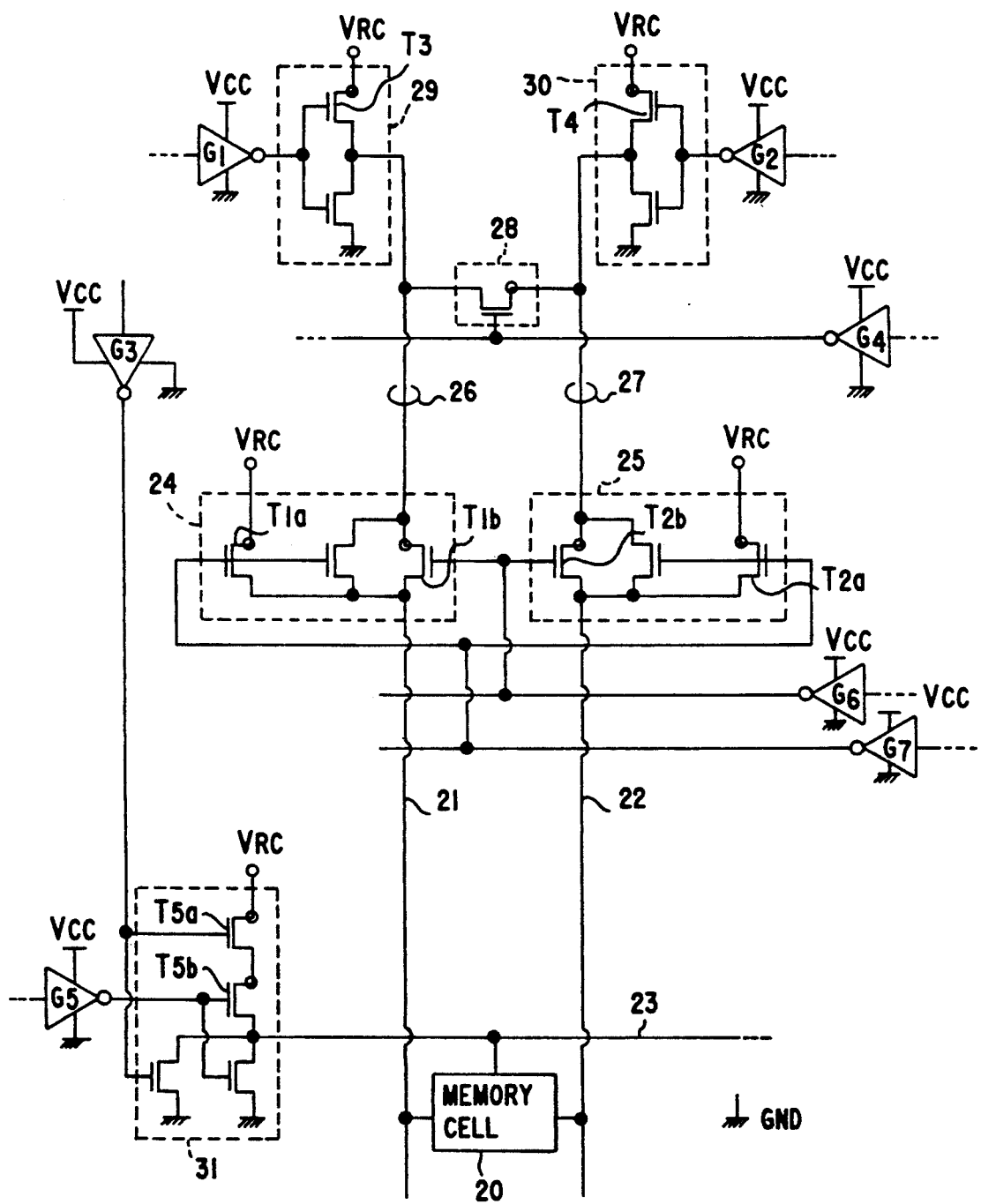
FIG.10 is a circuit diagram of an application of the present invention.

FIG.10 is a circuit diagram of an application of the present invention. The circuit configuration shown in FIG.10 is a SRAM (Static Random Access Memory) circuit, and uses the normal (external) power supply voltage $V_{CC}$ and the dropped power supply voltage $V_{RS}$. A memory cell 20 is coupled, via bit lines 21 and 22 and a word line 23, to transfer gates 24 and 25, common bit lines 26 and 27, an equalized transistor 28, bit line driving circuits 29 and 30, and a word line driving circuit 31. The active circuits other than the common bit lines 26 and 27 are $V_{RC}$ system gate circuits which are driven by the dropped power supply voltage $V_{RC}$ (equal to, for example, 4 V) generated from the external power supply voltage $V_{CC}$ (equal to, for example, 5 V). Use of the dropped power supply voltage $V_{RC}$ substantially prevents a decrease in the breakdown voltages of the elements.

Each $V_{RC}$ system gate includes at least one PMOS transistor. More specifically, the transfer gate 24 includes PMOS transistors T1a and T1b, and the transfer gate 25 includes PMOS transistors T2a and T2b. The bit line driving circuit 29 includes a PMOS transistor T3, and the bit line driving circuit 30 includes a PMOS transistor T4. The word line driving circuit 31 includes PMOS transistors T5a and T5b. The equalized transistor 28 is a PMOS transistor.

The above PMOS transistors are driven by output signals of gates G1–G7, as shown in FIG.10, and the $V_{RC}$ system gate circuits including these PMOS transistors function as logic circuits immediately subsequent to the $V_{CC}$ system gate circuits. The gates G1–G7 are $V_{CC}$ system gate circuits which are driven by the power supply voltage $V_{CC}$. Each of the gates G1–G7 has a high logic level approximately equal to $V_{CC}$, and a low logic level approximately equal to the ground level.

Before data is read out from the memory cell 20, the common bit lines 26 and 27 are shortcircuited by the equalized transistor 28. The word line driving circuit 31 selects the word line 23, and thus the memory cell 20 becomes connected to the bit lines 21 and 22. Then, a current passes through the memory cell 20 from one of the bit lines 21 and 22. There is no change in current which passes through the other bit line. Then, the transfer gates 24 and 25 are turned ON, so that the currents passing through the bit lines 21 and 22 are transferred to the common bit lines 26 and 27, respectively. A sense amplifier (not shown for the sake of simplicity) connected to the common bit lines 26 and 27 senses and amplifies the difference between the currents passing through the common bit lines 26 and 27.

When data is written, one of the bit line driving circuits 29 and 30 sets one of the common bit lines 26 and 27 to a high level and sets the other common bit line to a low level. The potentials of the common bit lines 26 and 27 are transferred to the bit lines 21 and 22 via the transfer gates 24 and 25, respectively. In this manner, data is written into the memory cell 20 which is selected by the word line driving circuit 31.

It will be seen from the description given above that the present invention includes a Bi-CMOS gate. It should be noted that the present invention can be applied to a circuit in which a PMOS transistor which is driven by the dropped power supply voltage receives the output signal of the $V_{CC}$ system gate circuit.

The present invention is not limited to the specifically disclosed embodiments, and variations and modifications may be made without departing from the scope of the present invention.

What is claimed is:

1. A semiconductor integrated circuit comprising:
   a first circuit outputting an output signals having a high logic numeral approximately equal to a first power supply potential; and
   a second circuit receiving the output signal, wherein:
   said first circuit comprises a first P-channel MOS transistor having a source receiving the first power supply potential and a drain output the output signal;
   said second circuit comprises a second P-channel MOS transistor having a gate receiving the output signal, a source receiving a second power supply potential lower than the first power supply potential, and a drain connected to an output terminal;
   said first and second P-channel MOS transistors respectively have threshold voltages at which predetermined identical drain currents defining a boundary between ON and OFF states of said first and second P-channel MOS transistors are obtained, each of the first and second threshold voltages being a gate-source voltage corresponding to a potential of the gate with respect to the source; and
   the second threshold voltage of said second P-channel MOS transistor is greater than the first threshold voltage of said first P-channel MOS transistor.

2. A semiconductor integrated circuit as claimed in claim 1, wherein the second threshold voltage of said second P-channel MOS transistor is equal to or smaller than a positive gate-source voltage at which one of the predetermined identical drain currents is obtained when decreasing the potential of the gate of said second P-channel MOS transistor from a highest gate potential substantially corresponding to the first power supply potential at which a drain current of said second P-channel MOS transistor is substantially zero.

3. A semiconductor integrated circuit as claimed in claim 1, further comprising:
- a first N-channel MOS transistor having a gate connected to the gate of said first P-channel MOS transistor, a drain connected to the drain of said first P-channel MOS transistor, and a source receiving a reference power supply potential; and
- a second N-channel MOS transistor having a gate connected to the gate of said second P-channel MOS transistor, a drain connected to the drain of said second P-channel MOS transistor, and a source receiving said reference power supply potential.

4. A semiconductor integrated circuit as claimed in claim 3, wherein said first N-channel MOS transistor has a size substantially identical to that of said second N-channel MOS transistor.

5. A semiconductor integrated circuit as claimed in claim 4, wherein said second N-channel MOS transistor has a size smaller than that of said first N-channel MOS transistor.

6. A semiconductor integrated circuit as claimed in claim 3, further comprising a third P-channel MOS transistor having a gate coupled to the drain of said second P-channel MOS transistor, a source receiving said first power supply potential, and a drain at which the first logic numeral corresponding to the reference power supply potential and the second logic numeral corresponding to the second power supply potential are selectively obtained.

7. A semiconductor integrated circuit as claimed in claim 6, wherein said third P-channel MOS transistor has a threshold voltage substantially identical to that of said first P-channel MOS transistor.

8. A semiconductor integrated circuit as claimed in claim 1, wherein said second P-channel MOS transistor outputs an output signal having a high logic numeral approximately equal to the second power supply potential.

* * * * *